US012748908B2

(12) United States Patent
Gao et al.

(10) Patent No.: US 12,748,908 B2
(45) Date of Patent: Sep. 29, 2026

(54) STATISTICAL GRAPH CIRCUIT COMPONENT PROBABILITY MODEL FOR AN INTEGRATED CIRCUIT DESIGN

(71) Applicant: Synopsys, Inc., Sunnyvale, CA (US)

(72) Inventors: Xiang Gao, San Jose, CA (US); Hursh Naik, Sunnyvale, CA (US); Bryan Charles Walsh, Coon Rapids, MN (US); Manish Sharma, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 674 days.

(21) Appl. No.: 18/226,188

(22) Filed: Jul. 25, 2023

(65) Prior Publication Data

US 2024/0037313 A1 Feb. 1, 2024

Related U.S. Application Data

(60) Provisional application No. 63/392,436, filed on Jul. 26, 2022.

(51) Int. Cl.
*G06F 30/398* (2020.01)
*G06F 30/27* (2020.01)
(Continued)

(52) U.S. Cl.
CPC ............ *G06F 30/398* (2020.01); *G06F 30/31* (2020.01); *G06F 30/27* (2020.01);
(Continued)

(58) Field of Classification Search
CPC ........ G06F 30/398; G06F 30/31; G06F 30/27; G06F 30/3308; G06F 30/367;
(Continued)

(56) References Cited

U.S. PATENT DOCUMENTS 6,336,108 B1 * 1/2002 Thiesson ................ G06N 5/025 704/256.4
7,958,470 B1 * 6/2011 Siarkowski ......... G06F 30/3312 716/136
(Continued)

FOREIGN PATENT DOCUMENTS

CN 106407490 A * 2/2017 ............. G06F 30/20
GB 2519545 A * 4/2015 ........... G06F 30/327
(Continued)

*Primary Examiner* — Phallaka Kik
(74) *Attorney, Agent, or Firm* — Patterson + Sheridan, LLP

(57) ABSTRACT

A system and method predicts performance of a circuit design by receiving circuit design training data and circuit design test data. The circuit design training data includes training nodes and training paths. The training paths connect the training nodes including circuit components. The circuit design test data includes a first test node and a second test node. Further, testing information is determined for the circuit components of each training path from the circuit design training data. A statistical representation of the circuit design test data is determined based on the testing information and the circuit design test data, and first test information for a test path connecting the first test node with the second test node is determined based on the statistical representation.

20 Claims, 9 Drawing Sheets

(51) Int. Cl.

| | |
|---|---|
| ***G06F 30/31*** | (2020.01) |
| ***G06F 30/3308*** | (2020.01) |
| ***G06F 30/367*** | (2020.01) |
| ***G06N 3/047*** | (2023.01) |
| ***G06N 3/08*** | (2023.01) |
| ***G06N 5/00*** | (2023.01) |
| ***G06N 7/01*** | (2023.01) |
| ***G06N 20/00*** | (2019.01) |

(52) U.S. Cl.
CPC ........ *G06F 30/3308* (2020.01); *G06F 30/367* (2020.01); *G06N 3/047* (2023.01); *G06N 3/08* (2013.01); *G06N 5/00* (2013.01); *G06N 7/01* (2023.01); *G06N 20/00* (2019.01)

(58) Field of Classification Search
CPC ........... G01N 3/047; G01N 3/08; G01N 5/00; G01N 7/01; G01N 20/00
USPC ....... 716/136, 106, 111; 703/16, 17; 706/12, 706/25, 33, 46
See application file for complete search history.

(56) References Cited

U.S. PATENT DOCUMENTS

| | | | | |
|---|---|---|---|---|
| 9,269,055 | B2 * | 2/2016 | Kushnir | G06N 20/00 |
| 9,519,732 | B1 * | 12/2016 | Gennari | G06F 30/398 |
| 9,547,745 | B1 * | 1/2017 | Juang | G06F 30/398 |
| 9,898,562 | B2 * | 2/2018 | Meyer | G06F 30/3308 |
| 9,928,327 | B2 * | 3/2018 | Acar | G06F 30/3323 |
| 11,475,194 | B1 * | 10/2022 | Yeung | G06F 30/3308 |
| 2011/0191091 | A1 * | 8/2011 | Joshi | G06F 30/367 716/106 |
| 2012/0253775 | A1 * | 10/2012 | Chan | G06F 30/398 703/14 |
| 2014/0129491 | A1 * | 5/2014 | Sayyar-Rodsari | G06N 3/02 706/12 |
| 2014/0157216 | A1 * | 6/2014 | Pandey | G06F 30/3323 716/106 |
| 2015/0213173 | A1 * | 7/2015 | Meyer | G06F 30/3308 703/14 |
| 2015/0379428 | A1 * | 12/2015 | Dirac | G06N 20/00 706/12 |
| 2016/0078361 | A1 * | 3/2016 | Brueckner | H04L 67/10 706/12 |
| 2017/0032274 | A1 * | 2/2017 | Yu | G06F 21/316 |
| 2017/0116362 | A1 * | 4/2017 | Jacobi | G06F 30/30 |
| 2017/0177749 | A1 * | 6/2017 | Acar | G06F 30/3323 |
| 2020/0184374 | A1 * | 6/2020 | Liu | G06F 16/2246 |
| 2020/0204577 | A1 * | 6/2020 | Song | G06N 5/022 |
| 2021/0383051 | A1 * | 12/2021 | Srinivasan | G06F 30/398 |
| 2022/0327269 | A1 * | 10/2022 | Seo | G06F 30/3312 |
| 2022/0383184 | A1 * | 12/2022 | Abelha Ferreira | G06N 20/00 |
| 2022/0414488 | A1 * | 12/2022 | Tian | G06N 5/022 |
| 2023/0098939 | A1 * | 3/2023 | Eloul | G06N 20/10 717/120 |
| 2023/0244535 | A1 * | 8/2023 | Front | G06F 11/3409 718/104 |
| 2025/0086933 | A1 * | 3/2025 | Moser | G06F 18/22 |
| 2026/0074711 | A1 * | 3/2026 | Cooper | H03M 7/3059 |

FOREIGN PATENT DOCUMENTS

| | | | | |
|---|---|---|---|---|
| JP | H0492976 A * | 3/1992 | | |
| WO | WO-2025207095 A1 * | 10/2025 | | G06F 30/367 |

* cited by examiner

STATISTICAL GRAPH CIRCUIT COMPONENT PROBABILITY MODEL FOR AN INTEGRATED CIRCUIT DESIGN

RELATED APPLICATION

This application claims the benefit of U.S. provisional patent application Ser. No. 63/392,436, filed Jul. 26, 2022, which is hereby incorporated herein by reference.

TECHNICAL FIELD

The present disclosure generally relates to an electronic design automation (EDA) system. In particular, the present disclosure relates to determining the predicted performance of an integrated circuit design based on a component statistical information model.

BACKGROUND

Electronic design and automation (EDA) systems verify the functionality of a circuit design. For example, EDA systems are used to verify that the circuit design meets the design requirements and/or manufacturing process requirements. An EDA system may analyze a circuit design to perform a timing analysis of the circuit design, routing analysis of the circuit design, fault detection within the circuit design, and/or fault debugging within the circuit design, among others. To perform the analysis an EDA system simulates the functionality of a circuit design to predict the behavior of the circuit design to determine whether or not the design requirements and/or manufacturing process requirements are met.

SUMMARY

In one example, a method includes receiving circuit design training data and circuit design test data. The circuit design training data includes training nodes and training paths. The training paths connect the training nodes including circuit components. The circuit design test data includes a first test node and a second test node. Further, the method includes determining testing information for the circuit components of each training path from the circuit design training data. The method further includes determining, by a processing device, a statistical representation of the circuit design test data based on the testing information and the circuit design test data, and determining first test information for a test path connecting the first test node with the second test node based on the statistical representation.

In one example, a non-transitory computer readable medium comprising stored instructions, which when executed by a processor, cause the processor to receive circuit design training data and circuit design test data. The circuit design training data including training nodes and training paths. The training paths include connect the training nodes including circuit components. The circuit design test data includes a first test node and a second test node. Further, the processor is caused to determine testing information for the circuit components of each training path from the circuit design training data. The processor is further caused to determine a statistical representation of the circuit design test data based on the testing information and the circuit design test data, and determine first test information for a test path connecting the first test node with the second test node based on the statistical representation.

In one example, a system includes a memory storing instructions, and a processing device. The processing device is coupled with the memory and executes the instructions. The instructions when executed cause the processing device to receive design training data and design test data. The design training data includes training nodes and training paths. The training paths include components and connect the training nodes. The design test data includes a first test node and a second test node. Further, the processor determines testing information for the components of each training path from the design training data. The testing information includes entries including values associated with the components. The processor further determines test information for a test path connecting the first test node with the second test node based on the entries of the components associated with the test path.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
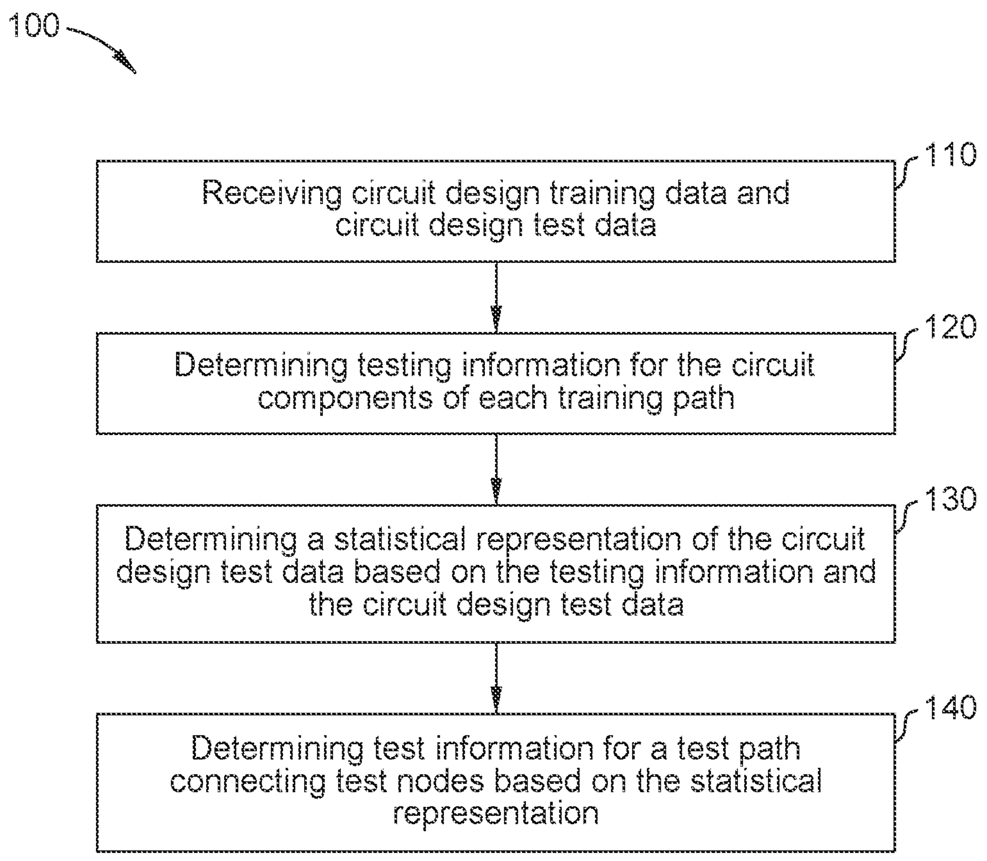
FIG. 1 illustrates a flowchart of a method for determining testing information for a circuit design.

Aspects of the present disclosure relate to statistical graph component probability model for an integrated circuit design. Electronic design and automation (EDA) systems analyze circuit designs to test the functionality of the circuit design to verify that the circuit design meets the corresponding design requirements and/or corresponding manufacturing process requirements. An EDA system performs one or more of a timing analysis of a circuit design, routing analysis of a circuit design, fault detection within a circuit design, and fault debugging within a circuit design, among others, to analyze the circuit design. An EDA system uses the netlist of a circuit design when analyzing the circuit design. In a netlist, cells and/or signals and corresponding components are interconnected via wires. An EDA system may employ machine learning (ML) techniques (or ML processes) to predict various metrics of a circuit design during analysis of the circuit design.

The ML techniques may include a random forest technique, which uses tabular feature data to predict the metrics of the circuit design. However, random forest techniques have not been applied to the netlist of a circuit design (e.g., graph data) as random forest techniques are applied to tabular feature data instead of netlists.

In other examples, the ML techniques include a graph neural network (GNN) technique that is applied to the netlist of a circuit design. In one or more example, the circuit design is a very large-scale integration (VLSI) circuit design. A VLSI circuit design includes a large numbers of logic gates, e.g., millions, or more. Accordingly, due to the heavy computation memory requirements, applying a GNN technique to a netlist of a VLSI circuit design includes partitioning the larger graph topology (e.g., graph) of the circuit design into smaller subgraphs (e.g., smaller partitions or portions). The subgraphs are used during analysis (e.g., fault prediction, timing delay prediction, and/or congestion prediction, among others) of a circuit design. As a netlist includes a graph topology of the integrated cells and/or signals of a circuit design, the circuit analysis process is further complicated. Further, a netlist is a special type of graph. In general, netlists are hierarchical having nodes with multiple abstract layers that can be flattened. Also, netlists use directional edges with one source and one or more readers (fan-out). However, common graphs do not include hierarchical nodes and directional edge usually only have 1 source and 1 sink. As a result, common ML techniques are not able to efficiently analyze a circuit design by analyzing the netlist. For example, some ML techniques are not able to apply subgraph pattern matching and are not able to utilize strong subgraph characteristics learned during training to analyze a circuit design.

In one or more examples, circuit design performance prediction processes using ML techniques as described herein are applied to VLSI netlists. In such examples, such processes include measurements of subsets (e.g., paths and nodes, among others) of netlists. The measurements correspond to path congestion, path timing, and faults, among others, taken on a subset of the netlist, such as paths. The ML techniques described herein may be used to generate predictions for the corresponding circuit design. In one example, local circuit graph data is converted into tabular data features, and an ML technique(s) is applied to the tabular data features. The ML technique includes regression, classification, and/or neural networks, among others. An example neural network is a convolutional neural network (CNN). However, such a process requires time-consuming feature engineering work to convert cell, wire, and topology information, into proper tabular features. Further, the iterations between feature engineering and model testing rely heavily on domain knowledge to explore new features. In another example, relevant node/edge features are assigned to the circuit graph, and the corresponding problem is converted into tasks suitable for a GNN. Example tasks include node classification, graph classification, and/or node/graph embedding, among others. However, in such a process, the VLSI circuit graph is too large and complex for GNN to process or process quickly. Further, the labelled data is not sufficient for proper training and testing. Additionally, there are some unique circuit properties that differentiate netlist from common graphs that are difficult to handle. For example, netlists include ordered edges assumed by a module's input/outputs (IOs) (while graph edges are unordered), hierarchical structures associated with cells, many different cell types, long range interactions among macros, pins, standard cells, and place and route features, among others.

The present ML system and method as described herein track statistics of subgraphs, such as path, or module of corresponding netlist, and build statistical model(s) from the statistics. As described herein, the ML techniques allow for a region of interest to be identified for defined metrics, provide predictions for unseen (unmeasured) netlists, and offer insights for model performance issues. The present ML system and method may be applied to areas such as congestion and timing predictions, fault detection and prediction, among others. As described herein, the present ML system and method may be applied to VLSI circuit device graphs. In one or more examples, circuit device graph ML problems can be cast into statistical problems on the corresponding graph. For example, node classification problems can be converted to class probability problems. Further, methods that capture the statistical relationship between the labeled subgraph and corresponding components are described herein. Specifically, subgraph labels are treated as statistical events contributed to (and from) associated graph components. In the training process, training data from graph components, paths, and/or subgraphs, are used for updating the statistics on the original graph and to generate a bookkeeping graph, and/or a hash table. During testing, for an unseen test cell, wire, paths, and module, among others, relevant statistics are recombined and used for prediction. The present ML system and method as described herein captures the graph topology information via a neighborhood hash process and/or an embedding process to evaluate a circuit design.

The technical advantages of the present disclosure include, but are not limited to, circuit analyses methods using ML techniques that generate results for a circuit design that are less complex and more efficient to debug than those generate by other ML techniques. Further, the ML techniques described herein do not include complicated feature engineering that are used to convert the circuit topology information into features, and does not use neural network solutions. Further, supervised ML methods may include a computation-heavy training stage. For example, a GNN ingests feature data from graph nodes and neighborhoods and trains associated network parameters in minibatches to meet embedding and training objectives. In the circuit design prediction process described herein, training is treated as bookkeeping of statistical information on the circuit graph, and testing is treated as inference from statistical data recorded on the bookkeeping graph. Other ML techniques perform the tasks of collecting data, training the model (e.g., via back propagation on mini-batches until the model converges), and testing the model in inference. However, for the ML techniques described herein, training includes parsing the data to generate hash tables, where statistical information is stored (e.g., during training) and retrieved (e.g., during testing). The ML techniques described herein are less computational complex to perform than previous ML techniques and scale linearly with input data size reducing the corresponding processor time and processor resources. Accordingly, the ML techniques as described herein uses less processor resources and processing time than other ML techniques, reducing the cost to analyze a circuit design and manufacture a corresponding semiconductor device based on the circuit design.

FIG. 1 illustrates a flowchart of a method 100 for determining testing information for a circuit design. In one or more examples, the method 100 is performed by an EDA system. The EDA system may be a computer system (e.g., the computer system 900 of FIG. 9). For example, a processing device (e.g., the processing device 902 of FIG. 9) of the EDA system executes one or more instructions (e.g., the instructions 926 of FIG. 9) stored within a memory device of the EDA system (e.g., the main memory 904 of FIG. 9 and/or the machine-readable storage medium 924 of FIG. 9) to perform the method 100. In one example, the method 100 is performed during EDA processes 812 of FIG. 8.

Figure 3:
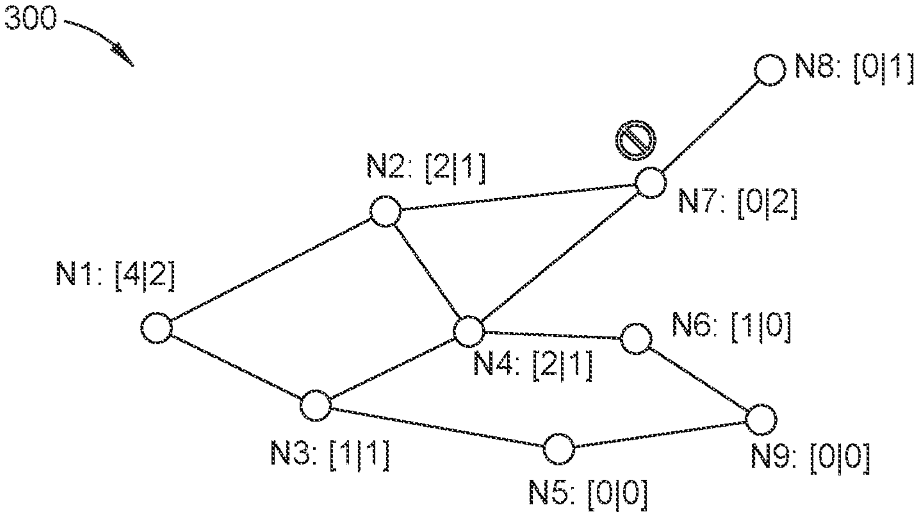
FIG. 3 illustrates prediction of a statistical information for a path within a circuit design device graph based on node statistical information in accordance with some embodiments of the present disclosure.

At 110, circuit design training data and test data associated with a circuit design (e.g., circuit design test data) is received. For example, an EDA system (e.g., the computer system 900 of FIG. 9) receives circuit design training data and the circuit design test data. In one example, the circuit design training data and the circuit design test data are stored within a memory device (e.g., the main memory 904 of FIG. 9 and/or the machine-readable storage medium 924 of FIG. 9). The circuit design training data includes training nodes and training paths. The training paths are connected nodes of circuit components by wires including fan-out (having one driver and many readers). The circuit design test data includes multiple test nodes within the circuit design. Further, the circuit design test data includes test paths that connect two or more of the test nodes. In one or examples, a test path may be connected to multiple test nodes. Further, two test nodes may be connected via multiple test paths. With reference to FIG. 3, the test nodes include N1-N8, and the test paths connect the test nodes.

Figure 2:
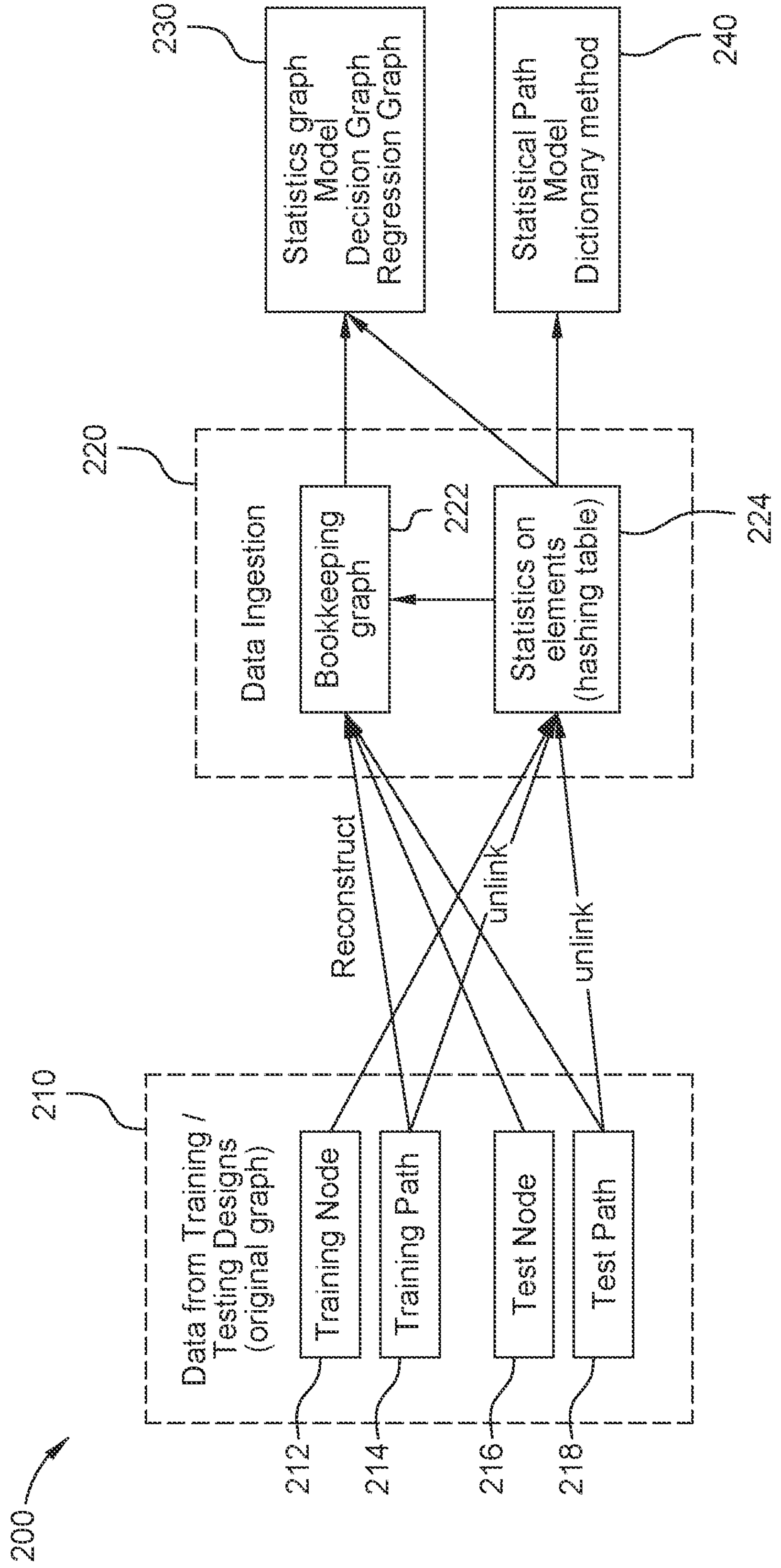
FIG. 2 illustrates block diagram of a graph-based statistical method for predicting circuit design performance in accordance with some embodiments of the present disclosure.

In one example, 110 of FIG. 1 includes receiving the training data and test data 210 of the method 200 of FIG. 2. The method of FIG. 2 may be performed by an EDA system. The EDA system may be a computer system (e.g., the computer system 900 of FIG. 9). For example, a processing device (e.g., the processing device 902 of FIG. 9) of the EDA system executes one or more instructions (e.g., the instructions 926 of FIG. 9) stored within a memory device of the EDA system (e.g., the main memory 904 of FIG. 9 and/or the machine-readable storage medium 924 of FIG. 9) to perform the method 100. In one example, the method 200 is performed during EDA processes 812 of FIG. 8. The training data and testing data 210 includes training node data 212, training path data 214, test node data 216, and test path data 218. The training node data 212 and test node data 216 include example nodes (e.g., logic gates, modules in a design hierarchy, and/or edges, where the corresponding statistics are recorded, etc.), and associated values (e.g., gate type, module type, module instance ID, and/or neighborhood hash vectors, among others). The training path data 214 and test path data 218 include example wires, signals, buses, and associated values (e.g., wire ID, signal name, bit width, etc.), and example training node data 212 and test node data 216 along the paths. The training path data 214 connects a subset of the nodes within the training node data 212. The test path data 218 connects a subset of the nodes within the test node data 216.

In one example, the training node data 212 and/or the training path data 214 and the test node data 216 and/or the test path data 218 are part of the same circuit design. In other examples, the training node data 212 and/or the training path data 214 corresponds to a circuit design or circuit designs different from that of the test node data 216 and/or the test path data 218.

At 120 of FIG. 1, testing information for the circuit components of each training path is determined. The testing information includes statistical information or circuit parameter information. Statistical information includes the number of passes and the number of failures for a given number of tests of a circuit component. In other examples, the statistical formation is not limited to the number of passes and/or number of failures, and may include additional information. Further, the statistical information may be a binary, trinary, or greater number. Circuit parameter information includes delay time of a circuit component or components, and congestion associated with a circuit component or components, among others.

In one example, the EDA system (e.g., the computer system 900 of FIG. 9) determines the testing information for the circuit components of each node path based on the circuit design training data and/or the circuit design test data. Determining the testing information includes determining a bookkeeping graph and/or a table of element data (e.g., a hashing table).

With reference to FIG. 2, 120 of FIG. 1 includes data ingestion 220 of FIG. 2. Data ingestion 220 includes generating a bookkeeping graph 222 from training data (e.g., training node data 212 and/or training path data 214) via the original circuit graph of a circuit design (or equivalent ML copies), or via a separate bookkeeping graph. The training node data 212 and/or the training path data 214 is used to build the bookkeeping graph 222 and/or the hashing table 224. Information associated with each circuit element of each training path and/or between training nodes is used to build the bookkeeping graph 222 and/or the hashing table 224. For example, cell type, cell name, cell instance, cell hierarchy, labels, wire instances (signal names), and certain operation characteristics (e.g., number of toggles, timing delays), among others is collected from the training node data 212 and the training path data 214 and used to generate the bookkeeping graph 222 and/or the hashing table 224. The bookkeeping graph 222 is optional, in one example, the bookkeeping graph 222 is omitted (e.g., not built) and the hashing table 224 is built.

The bookkeeping graph 222 is a set of graphs that can be constructed from the training path data 214 and test path data 218 (or subgraphs). The training path data 214 and test path data 218 are samples generated from a circuit design graph or graphs. The bookkeeping graph 222 is reconstructed from the training path data 214 and the test path data 218. The bookkeeping graph 222 includes paths between interconnected nodes. For example, nodes are connected via edges, forming the paths of the bookkeeping graph. The bookkeeping graph 222 is a subset of the original design circuit graph with some missing topology information based on the lack of coverage of sampling. In one or more examples, two or more paths overlap with each other, i.e., with common nodes/edges. In such examples different paths can be pieced together to form one connected subgraph of the original graph. For paths that have no overlaps, separated subgraphs are formed. In one example, separate subgraphs are formed for such paths, even if those paths are connected on the original graph.

In one example, the bookkeeping graph is a node instance bookkeeping graph. In such an example, the testing information is associated with the nodes of the bookkeeping graph. In another example, the bookkeeping graph is an edge instance bookkeeping graph. In such an example, the testing information is associated with the edges of the bookkeeping graph. In one or more examples, based on a determination that the training path data 214 and the test path data 218 are associated with nodes, a node based bookkeeping graph is generated. In one example, the training path data 214 and the test path data 218 includes an identifier or another type of indicator that associates the training path data 214 and the test path data 218 as being associated with nodes. In another example, the testing information is associated with the nodes of the bookkeeping graph. Based on a determination that the training path data 214 and the test path data 218 are associated with edges, an edge based bookkeeping graph is generated. In one or more examples, based on a determination that the training path data 214 and the test path data 218 are associated with nodes and edges, a node and edge based bookkeeping graph is generated.

The hashing table 224 uses the cell/net instances (or type, or hash values from neighboring nodes) as key entries, so that the occurrences of the cell/instances in training data set can be recorded and retrieved. In one example, the training data is analyzed to determine each cell (net) instance, cell (net) type, and/or hash values from neighboring nodes. The cell instances, cell types, and has values are used to build the hashing table 224. A hashing function used to build the hashing table 224 may be selected based a collision rate and/or other performance parameters. Different hashing functions provide different hashing tables with different performance parameters.

In one or more examples, in the bookkeeping graph 222 the keys are nodes, edges are hash vectors (for local neighborhood hashing), and/or the values are the testing information for bookkeeping. In one example, two or more paths have a shared starting point and a shared ending point. Path data collected along the paths, can be cell type, cell name, cell instance, cell hierarchy, labels, wire instances (signal names), and certain operation characteristics (e.g., number of toggles, timing delays), among others. Labels (or target values) that are attributed to the path, or subgraph, are then attributed to the path, or subgraph components, and recorded by the bookkeeping graph 222. During testing, nodes, or components from test node or path, or subgraph) are looked up in the bookkeeping graph 222 and statistics of the associated components are inferred from the bookkeeping graph 222. If the testing nodes or paths are not found in the bookkeeping graph 222, or if a bookkeeping graph is not included, a testing subgraph or path can be reconstructed out of the components from the hashing table 224.

The bookkeeping graph 222 can be reconstructed from the training data, or a hashing table 224 (e.g., a hash table storing the element statistics). In one example, one or more graphlets (e.g., connected subgraphs) of the bookkeeping graph 222 are generated from the training data and testing data 210. Each graphlet is generated with a unique instance identifier (ID) for each element that is obtained from the training data and testing data 210. The instances of each element are extracted from the training data and testing data 210 as a graphlet (or graphlets). The graphlets that are determined to overlap are combined (e.g., pieced together) to form the bookkeeping graph 222. In one or more examples, the netlists of the training or test data 210 are not available, but detailed path data is provided instead. In such examples, the bookkeeping graph 222 can be constructed out of the path data when node data and/or edge data is provided.

In one or more examples, the training path data 214 is unlinked to provide the list of nodes (and edges) along the path, to update the associated statistics in the hashing table 224, and to reconstruct the bookkeeping graph 222. The test path data 218 can be unlinked to provide the list of nodes (and edges) along the path, to retrieve nodes' (and edges') statistics from the hashing table 224, and to reconstruct and update the bookkeeping graph 222.

Further, in one or more examples, the bookkeeping graph 222 is built out of the training path data 214. For example, the bookkeeping graph 222 is built from the hashing table 224. Separately building the bookkeeping graph 222 can be used in instances where training data and testing data 210 cover a relatively small subset of the original netlist of the circuit design. From the smaller subset, query matching subgraphs for the test subgraph can be completed to generate the bookkeeping graph 222.

At 130 of FIG. 1, a statistical representation of the circuit design test data is determined based on the testing information and the circuit design test data. For example, the EDA system (e.g., the computer system 900 of FIG. 9) determines the statistical representation of the circuit design test data. In one example, determining the statistical representation includes generating a statistical graph model and/or a statistical path model. A statistical graph model is a decision graph model or a regression graph mode, among others. The statistical path model is a dictionary path model. The statistical graph model is a model that ingests the input graph (e.g., the bookkeeping graph 222 and/or hashing table 224) with statistical information for the corresponding graph elements, and generates outputs for a node (or nodes), edge (or edges), path (or paths), circuit component (or circuit components) (as in a hierarchy), and/or neighborhood, among others in the input data (e.g., the bookkeeping graph 222 and/or the hashing table 224). For example, to evaluate the average delay from one circuit component to another circuit component, the possible paths between the circuit components are identified. Then along each path, the delay statistics are collected among the graph elements, and recombined to estimate the average delay.

In one example, 130 of FIG. 1 includes generating a statistical graph model 230 from the bookkeeping graph 222 with the statistics of the elements (nodes/edges) from the hashing table 224 using query operations at FIG. 2. In one example, an EDA system determines predictions from the statistical graph model 230 for a given test path data 218 (or elements) by: (1) locating the path (or elements) from the bookkeeping graph 222, to retrieve topology information related to the test path (other than the test path itself) from the bookkeeping graph 222, and (2) the testing information from related neighborhood elements (based on topology) from the hashing table 224, and are combined together to make predictions. The methods for combining the statistics for the path elements are described in greater detail in the following. In one or more examples, the paths from both the training data and test data are used to reconstruct the bookkeeping graph if the training data and test data are from the same netlist (design). If training and test paths are from different design netlists, then a type-based bookkeeping graph would be used among different designs. Further, the bookkeeping graph 222 can be optional, and the statistical path model 240 can be generated from the test node data 216 and/or the test path data 218 with statistics obtained from the hashing table 224, without building a bookkeeping graph.

The statistical path model 240 can be used to perform predictions by an EDA system in ways similar to that of the statistical graph model 230, using statistics from test data path elements, while the statistical graph model 230 can offer statistics from the neighborhood not captured by the test path.

At 140, test information for a test path connecting test nodes is determined based on the statistical representation. For example, the EDA system (e.g., the computer system 900 of FIG. 9) determines the test information from the statistical representation. The test information includes statistical information and/or parameter information. The test path and/or test nodes may be provided to the EDA system with the circuit design by a circuit designer. In one example, multiple test paths and corresponding test nodes are provided along with the circuit design.

In one example, determining the test information includes determining statistical information and/or parameter information. In one example, a hashing table (e.g., the hashing table 224) is used to store and retrieve statistical values for an entry (e.g., a node). A hashing table provides fast query and storing operations. In one or more examples, the statistical graph model 230 and/or the statistical path model 240 are used to determine one or more properties of a circuit design. In one or more examples, the properties determined using the statistical graph model 230 and/or statistical path model 240 are computationally expensive to determine. For example, the statistical graph model 230 and/or statistical path model 240 are used to determine a probability of finding a fault within a cell of a circuit design.

In one example, as is described in greater detail in the following, the test path is between nodes N1 and N9 of the bookkeeping graph 300. The nodes N1 and N9 are connected via a first path including nodes N1, N2, N4, N6, N9 and a second path including nodes N1, N3, N5, and N9. Adjacent nodes are connected via an edge of the bookkeeping graph. Each node is associated with statistical information. In other examples, the nodes are associated with circuit parameter information. As illustrated in FIG. 3, each node is associated with a number of test passes and a number of test failures. To determine the statistical information for the path between node N1 and node N9, the statistical information for each node of the associated paths are combined. For example, the statistical information may be combined via summation, numeric average, weighted average, or multiplication, among others. In one specific example, the statistical information of each node along each path is summed. In such an example, the path associated with the nodes N1, N2, N4, N6, and N9 has a combined statistical information of [9|4] (e.g., [passes|failures], which are described in greater detail in the following) and the path associated with the nodes N1, N3, N5, and N9 has a combined statistical information of [5|3]. Accordingly, the total statistical information for the two paths is the combination or sum of the combined statistical information for each path, or [14|7].

In other examples, the combined circuit parameter information for the path between two nodes is determined instead of the combined statistical information. For example, the combined delay or congestion for the path between the two nodes is determined. The combined delay or congestion for the path may be determined via summation, numeric average, weighted average, or multiplication, among others. In one example, the delay associated with each node N1, N2, N4, N6, and N9 is summed to determine a first path delay and the delay associated with each node N1, N3, N5, and N9 is summed to determine a second path delay. A total delay is determined by combining the first and second path delays.

In one example, the test information for two or more test paths within the circuit design is determined as described above. The different test paths may include one or more common nodes, or include different nodes.

In one or more examples, the test information for a test path is output. The test information may be output as part of a report (e.g., a debug report or another type of test report) for the corresponding circuit design. The report may include the test information for one or more test paths. In one example, the report is output to a display (e.g., the video display unit 910 of FIG. 9), communicated to another system via a network (e.g., the network 920 of FIG. 9), and/or stored within a memory device (e.g., the main memory 904 of FIG. 9 and/or the machine-readable storage medium 924 of FIG. 9). Additionally, the report is printed and/or output in some other way.

FIG. 3 further illustrates an example where the statistics associated with the nodes, edges, and/or graph components obtained during training are stored in a hash table. The statistics are determined from the circuit components of each training node as is described with regard to 120 of FIG. 1. Further, the bookkeeping graph 300 is a statistical representation that is determined from the statistics as is described with regard to 130 of FIG. 1. During testing of the corresponding circuit design, the component statistics are applied directly to the matching components (via hash vector) on the testing subgraph/path. Such a process is more efficient than previously applied processes that do not include such a statistical determination process and avoids the subgraph query and the graph-to-graph prediction problems that are present in other circuit prediction processes. Further, neighborhood information besides type information can also considered when matching nodes from different subgraphs. For example, hash functions, or graph node embedding from GNN, can be used for hashing a node's 1-hop or 2-hop neighbors into hash vectors. Further, statistics can be recorded within an associated hash, embedding, vector. A K-hop neighbor is a neighboring node that can reach source node in less than K steps. Equations 2-5 describe various K-hop neighbor instances. Similar methods can be applied to edges as well. Accordingly, the matched training node and test node may also have the same K-hop neighborhood in terms of type. For nodes with the same type and neighborhood, the corresponding behavior is similar and shares the same statistics regardless of training or testing. With statistics properly assigned for the components of the testing subgraph, the predictions can then be computed from the subgraph. For example, depending on the nature of the target, the prediction can be from a numeric average, weighted average, or product, from nodes with known statistics, or statistics with high confidence, among others.

In one example, the bookkeeping graph 300 is a node based bookkeeping graph with node instances provided. In the bookkeeping graph 300, the testing information (e.g., statistical information) is associated with each of the nodes. In one example, a node based bookkeeping graph is determined based on node type being provided for the path data.

Figure 4:
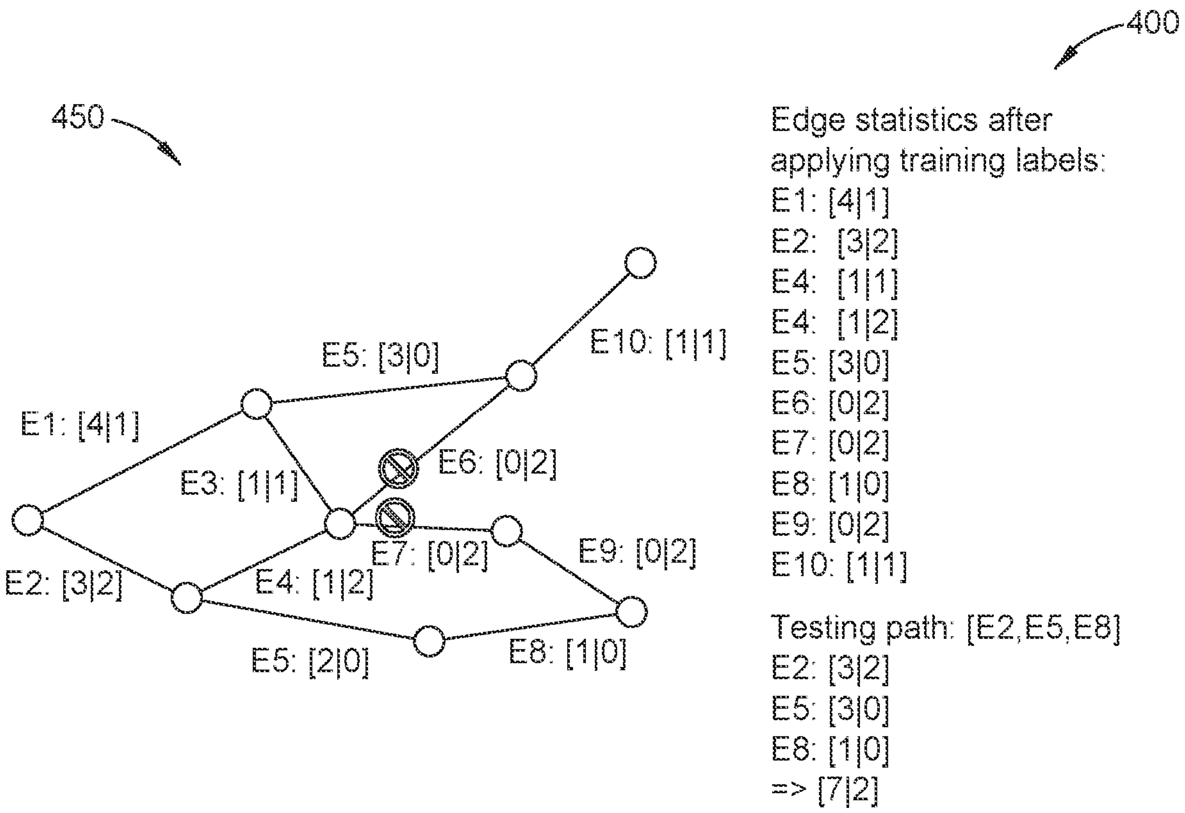
FIG. 4 illustrates prediction of a statistical information for a path within a circuit design graph based on edge statistical information in accordance with some embodiments of the present disclosure.

In the example of FIG. 4, the test paths are directly found on the bookkeeping graph 300. Accordingly, predictions can be made from the bookkeeping graph directly. For example with regard to FIG. 3, the graph path evaluated for prediction is N9_pred. The subgraph 300 of FIG. 3 includes nodes N1-N9, and associated paths. Each node N1-N9 is associated with a corresponding statistical information (e.g., probability). For example, node N1 has a statistical information of [4|2], the node N2 has a statistical information of [2|1], the node N3 has a statistical information of [1||], the node N4 has a statistical information of [2|1], the node N5 has a statistical information of [0|0], the node N6 has a statistical information of [1|0], the node N7 has a statistical information of [0|2], the node N8 has a statistical information of [0||], and the node N9 has a statistical information of [0|0]. The statistical information of each node corresponds for a given number of tests, the number of passes and the number of failures ([passes|failures]). In other examples, delay time, congestion, and/or other circuit parameters may be used in addition to, or alternatively to, passes and failures. Further, the statistical information associated with each node may binary as illustrated in FIG. 3, or trinary or greater may be used.

To predict the statistical information of a path from node N1 to node N9, the statistical information of the nodes along the path from node N1 to node N9 are used. For example, a first path from node N1 to node N9 includes nodes N1, N2, N4, N6, and N9. A second path from node N1 to node N9 includes nodes N1, N3, N5, and N9. The cumulative statistical information of the first path is determined by adding the statistical information of each of the nodes N1, N2, N4, N6, and N9. Further, the cumulative statistical information of the second path is determined by adding the statistical information of each of the nodes N1, N3, N5, and N9. The statistical information of the first path is [9|4] and the statistical information of the second path is [5|3]. The combined statistical information of the first path and the second path is [14|7]. As the statistical information of a pass occurring is twice that of a failure occurring, the statistical information along the path from node N1 to node N9 can be simplified to [1|0].

In one example, node N7 may be determined to be a triggering node as the pass/failure statistical information associated with node N7 is not associated with that of the nodes N2 and N4 that are connected to the node N7.

In one or more examples, when the test subgraph is not completely found on the bookkeeping graph (e.g., the bookkeeping graph 300), the test subgraph can be rebuilt out of the graph elements (node/edge) from the test graph, using statistics from the hashing table (e.g., the hashing table 224 of FIG. 2). In one example, graph-aware predictions can be performed without using a bookkeeping graph at all (e.g., the statistical path model 240 of FIG. 2).

While FIG. 3 is described with regard to node statistical information, in other example, edge statistical information may be used during prediction of a path statistical information similarly as described with regard to FIG. 3. Further, while FIG. 3 performs prediction by summing the corresponding statistical information, in other examples, multiplication and/or statistical information computations via weighted averages, among others, may be used.

FIG. 4 illustrates an edge based bookkeeping graph 450 determined based on edge instances. In other examples, a bookkeeping graph can have both node and edge statistics if path data includes both node and edge statistics. When both training netlist and test netlist are given, the bookkeeping graph is built, without any statistics, out of the test netlist. Accordingly, the test node or path queries can be indexed during the construction from test netlist. Further, the bookkeeping graph has the complete neighborhood even when a single path is provided from one test.

In the example of FIG. 4, GCP using training paths with labels and test paths without a bookkeeping graph is shown. In FIG. 4, edge statistical information (e.g., edge probabilities) is used for prediction of the corresponding circuit design. FIG. 4 illustrates edge statistical information 400 and associated edges E1-E10. The edge statistical information is used similar to the node statistical information with regard to FIG. 3 to perform prediction. The bookkeeping graph 450 showed is for informational purposes. The edge statistical information from the training data is recorded as a hashing table, or dictionary (e.g., the hashing table 224). For the test path, the statistics can be computed either by counting as shown, or by statistical information computations via weighted averages, etc.

In one example, the testing path to be predicted includes edges E2, E5, and E8. The statistical information of the testing path includes a combination of the statistical information of the edges E2, E5, and E8. For example, the statistical information associated with the edge E2 is [3|2], the statistical information associated with the edge E5 is [3|0], and the statistical information associated with edge E8 is [1|0]. In one example, the combined statistical information for the associated test path is [7|2].

In FIG. 4, edges E6 and E7 are triggering edges that cause the detection results for all sampled paths. The statistics in the neighborhood, e.g., edges connected to edge E6 and E7, are controlled by statistical information of edges E6 and E7, respectively. The prediction from the statistical GCP model is influenced more by the same triggering edges (e.g., causes) than by non-relevant graph elements. The graph elements that have highly unbalanced statistics with large support would be of great interest for identifying root causes, and for explaining and debugging model performances, etc.

Figure 5:
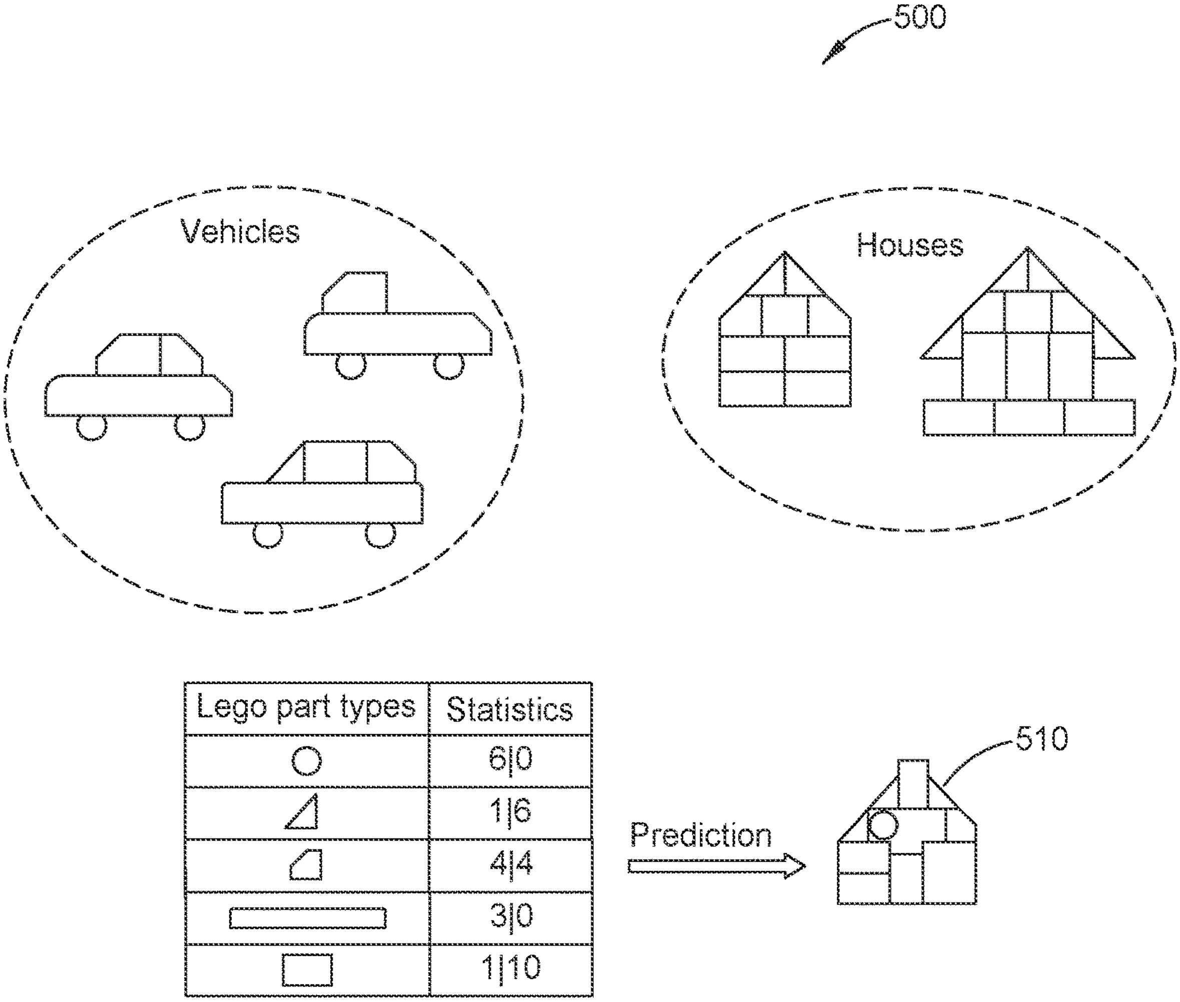
FIG. 5 illustrates an illustrative example for using blocks to build a graph based statistical analysis approach, graph component probability (GCP), in accordance with some embodiments of the present disclosure.

FIG. 5 illustrates an explanation 500 of GCP via block building experiments, where the final object's class statistical information is approximated by the sum of the building block type class statistical information. The GCP model described herein can capture "building blocks" from the graph node/edge and/or from neighborhoods via hash or embedding functions. In one or more examples, each part is included within the hash table. The five parts are used in the five structures with the corresponding statistics. For example, for circular, or wheel, parts, the statistics is (6|0). Accordingly, the circular part was counted six times in "vehicles" and zero times in "houses". When performing inference on the structure 510, a structure not included in the training data, prediction is made based on the parts used, by combining the statistics for each of the used parts. In one or more examples, the statistics may be combined in different ways, for example, by applying different weights on the statistics from different parts, among others.

Figure 6:
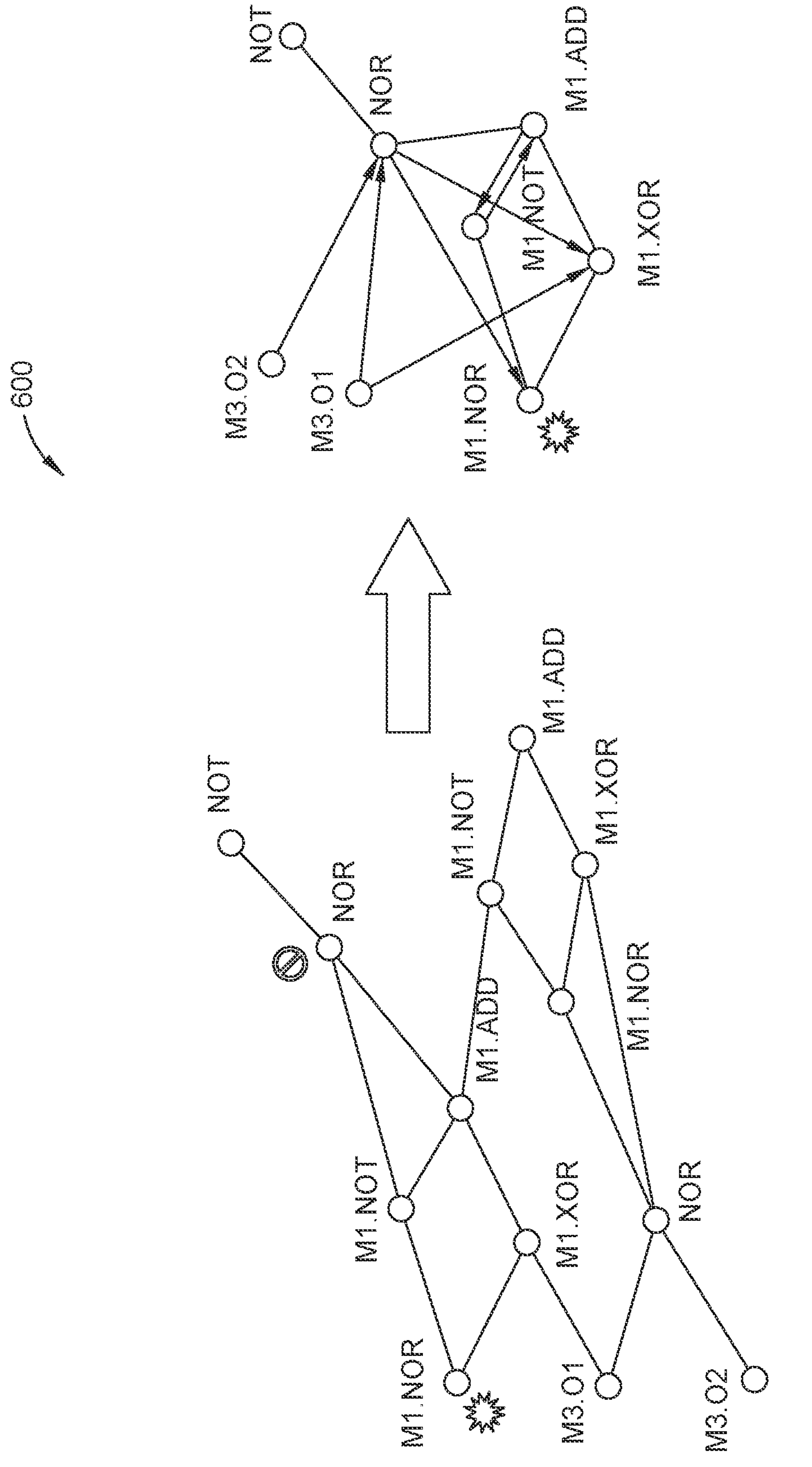
FIG. 6 illustrates a collapsed subgraph of a circuit design in accordance with some embodiments of the present disclosure.

In one or more examples, the amount of training data is less sufficient and covers a small subset of a corresponding circuit graph. In such an example, building instance-based bookkeeping has less coverage from training data to test data. Further, as about 10 to about 20 different logic gate types are used in a modern integrated circuit (IC) device, gate type information may be used in the ML process to improve the corresponding coverage. However, using a limited number of basic types places a strong bias on the basic types by assuming one gate type would have one statistical behavior regardless of the corresponding neighborhood. However, a gate's statistical behavior can be assumed to be primarily influenced by neighbors (e.g., gates connected to inputs and outputs of a gate), and the same gates might behave differently within different context or neighborhoods. Accordingly, ML techniques that use type information along with neighborhood type information provide a more accurate prediction for a circuit design as compared to ML techniques that do not use neighborhood type information. One way of achieving that is to use the hierarchical type information of the leaf module that houses the gates FIG. 6 illustrates an example 600 of hierarchical-cell-type bookkeeping that uses type information and neighborhood type information. FIG. 6 illustrates a cell-instance graph that can be collapsed into hierarchical-cell-type bookkeeping graph to enhance data coverage, and increase cross-design applicability. The number of bottom-up levels, 1-level, or 2-level, would yield different number of unique types, thus allow tuning for different training node coverages. Additionally, hash or node embedding (from GNN) can be used to embed local topology information, providing a different type of node matching, suitable when modules are flattened. The hash function of equation 1 is applied to the cell type c, associated input cell types (Input(c)), and associated output cell types (Output(c)). In equation 1, $V_c$ is the embedding vector:

$$V_c = \text{hash}(c, \text{Input}(c)|\text{Output}(c)) \quad \text{Equation 1}$$

Equation 1 is for a 1-hop neighborhood. Equation 1 can be used recursively for K-hopes (K is one or more). For example, equation 2 illustrates an example where K=2, 2-hop.

$$V_c = \text{hash}(c, \text{Input}(c)|\text{Output}(c)) \quad \text{Equation 2}$$

$$\text{Input}(c) = \text{hash}(\text{Input}(c), \text{Input}(\text{Input}(c))|\text{Output}(\text{Input}(c)))$$

$$\text{Output}(c) = \text{hash}(\text{Output}(c), \text{Input}(\text{Output}(c))|\text{Output}(\text{Output}(c)))$$

Hash functions or embedding like equations 1 and 2 are be applied to large netlists and offer adjustable range for neighborhood discovery.

Figure 7:
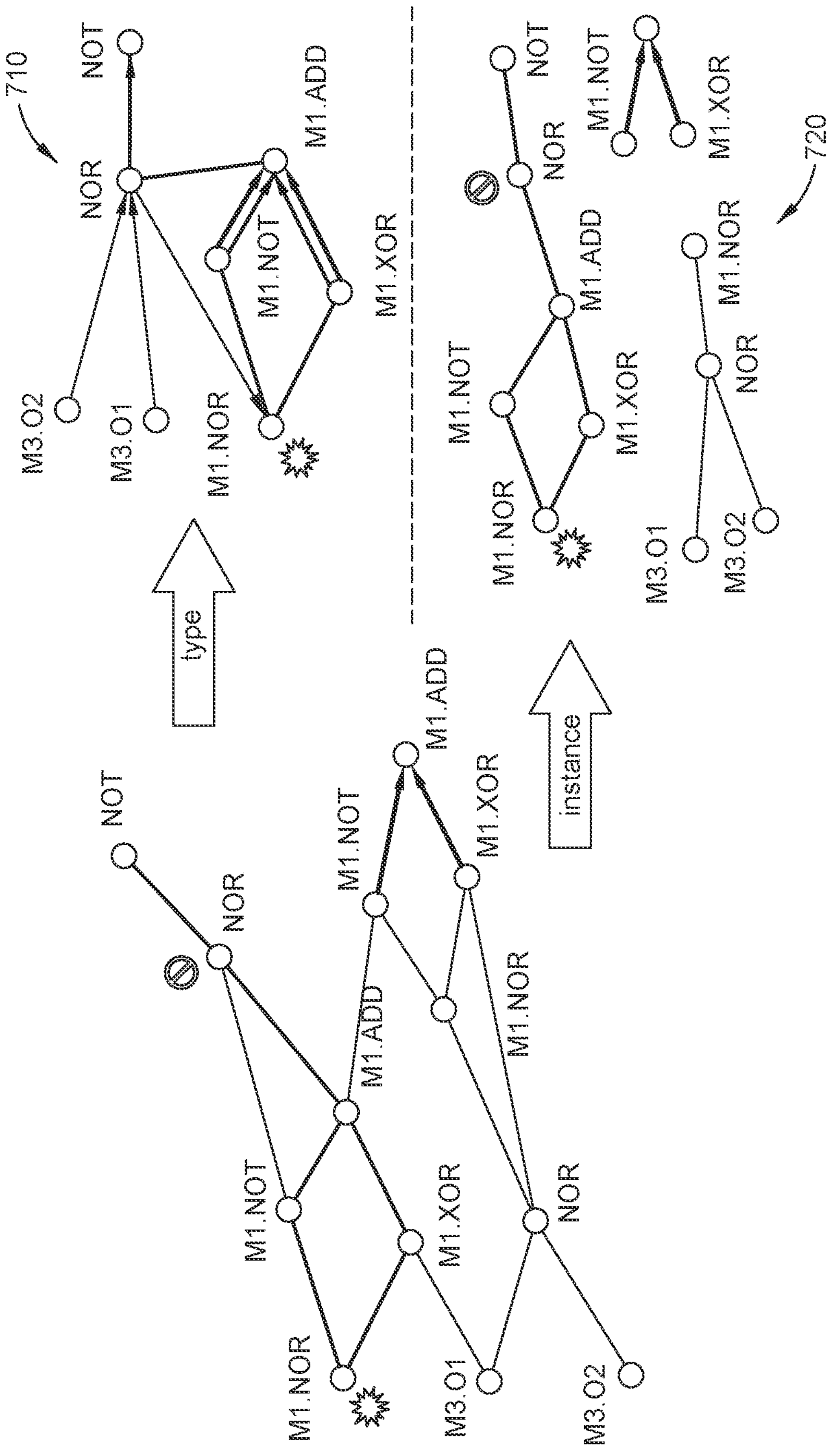
FIG. 7 illustrates multiple subgraphs and a collapsed subgraph of a circuit design in accordance with some embodiments of the present disclosure.

FIG. 7 shows the difference between a type bookkeeping graph 710 and an instance bookkeeping graph 720. A type bookkeeping graph 710 is used when training and test data are from different netlists or different circuit designs. An instance bookkeeping graph 720 is used for prediction on the same netlist or same circuit design. In one example, an instance of a circuit node (cell) is an instance of a circuit node "type". For example, a node instance ID0001 can be an AND logic GATE type, or a user defined hierarchical type, "SUM4.add_1". In a circuit design there may be many instances of the same type. The instances of the same type have the same function and same behavior. The behavior of an instance is represented by a model on the "type". In one or more examples, a bookkeeping graph can use instance names so that original instances from the circuit graph can be duplicated, but the resulted graph does not show relationship among the "types" (or models). In one example, to capture "type", the bookkeeping graph can use the hierarchical "type" information of the node to rebuild a different graph with less nodes, among others. In one example, as illustrated in FIG. 7, insufficiently sampled paths on the circuit instance graph produce multiple separated subgraphs as a bookkeeping graph (e.g., the bookkeeping graph 222 of FIG. 2). Using type to generate a bookkeeping graph (e.g., the bookkeeping graph 710) is less likely to produce disconnected subgraphs. In one or more examples, for different training circuit designs, the different training circuit designs can use either the shared or separate type-based bookkeeping graph(s). When separate bookkeeping graphs are used for different training designs, each bookkeeping graph can be used to perform respective predictions. The individual predictions can be combined as the final prediction. This would yield an ensemble of statistical graph models. The ensample of the statistical graph models can be provided separately.

The graph can be represented by G=G(V, E), where V, E are node and edge sets, respectively. The node $v \in V$ and edge $e \in E$ are from different types, $T_v$ and $T_e$. Further, there is an associated neighborhood, for example 1-hop: $N(v_j)=\{v_i\}$ for $\forall v_i v_j \in E$. The hash function can be defined by equations 3 and 4.

$$f(v) = h_v \in \mathbb{R}^d, \quad \text{Equation 3}$$

$$f(T_v) = h_{T_V} \in \mathbb{R}^d \quad \text{Equation 4}$$

Similarly, 2-hop or other types of neighborhood such as up-stream paths can be described. Then for a neighborhood of a set of graph elements, $N(v)=\{v_N, e_N\}$, the hash can be fined based on equation 5.

$$f(N(v)) = \sum_{v_N \in N(v)} f(v_N) + \sum_{e_N \in N(v)} f(e_N) = h_{N(v)} \in \mathbb{R}^d \quad \text{Equation 5}$$

Equation 5 assumes commutative property of the nodes and edges. To make the order of nodes and edges matter, i.e., noncommutative as nodes in a path, equation 6 can be used.

$$f(N(v)) = \sum_{v_N \in N(v)} f^{i_v}(h_{v_N}) + \sum_{e_N \in N(v)} f^{i_e}(h_{e_N}) = h_{N(v)} \in \mathbb{R}^d \quad \text{Equation 6}$$

In equation 6, $i_v$ and $i_e$ are the index of node and edge on the path, respectively. To preserve IO port order, for example, for register cell types, the corresponding edge vectors can undergo different number of hash operations, for example, IO ports can be assigned by priority, $p_{e_N} \in \{0, 1, 2, \ldots\}$, then based on the priority value, additional hash operations can be performed based on equation 7.

$$h_{e_N} = f^{p_{e_N}}(e_N) \quad \text{Equation 7}$$

Equation 7 can be simplified as illustrated in equation 8.

$$h_{e_N} = (p_{e_N} + 1) f(e_N) \quad \text{Equation 8}$$

In other examples, other hash schemes can be designed, such as rotate the vector by different angles, and translate the vector by different displacements, among others. The other schemes ensure that the IO port order differences can be reflected by the final hash vector. Ensuring that the IO port order differences are reflected can be guaranteed if all possible combinations can be verified against collisions in hashing.

During training, for labels associated with a neighborhood, such as a path, or paths, or just a node or edge, the statistics is updated to the associated hash vector(s). Causes (e.g., triggering nodes/edges) for certain labels are determined based on abnormal statistics. In one example, class probability (statistical information) for a test neighborhood can be defined as illustrated in equation 10.

$$P(v_N = y) = \text{lookup}(h_{v_N}, y) \quad \text{Equation 10}$$

Equation 10 assumes the probability on the graph is accumulative, i.e., related to the associative and commutative properties of the contributions of a component to a given target. For behaviors that not associative or commutative, the behaviors can be captured by the neighborhood hash vectors. Also, multiplication can be used, if the probability of class is joint probability of events along the paths.

In one or more examples, the results or statistics reported by the GCP model can be used as features for ML methods. Further, special paths, such as certain logical gate long paths, can be identified and selected for hashing, to compensate the limited local topologies from 1-hop, 2-hop, n-hop neighborhood. In one or more examples, user engineered paths, or subgraph types can be used for bookkeeping. In one example, a bookkeeping graph, a training graph, a testing subgraph can be the same graph. In another examples, a test netlist can be converted directly as a bookkeeping graph, then updated by statistics from the training netlist. In this way, a more complete neighborhood can be considered for the testing subgraph (path). In one examples, when building the type or instance bookkeeping graph, strict rules can be applied to ensure that signal flow the same direction in the bookkeeping graph as the bookkeeping graph is on the original netlist. In some applications, such as molecules classification, modules from netlists, the training labels are assigned to the whole graph, instead of parts of the training graph, the same statistical approach can still be applied. Further, when establishing a node's neighborhood, up-stream and/or down-stream elements on signal paths can be considered. The choice of up-stream or down-stream depends on which are logically contributing to the labels at the measurement graph element.

Figure 8:
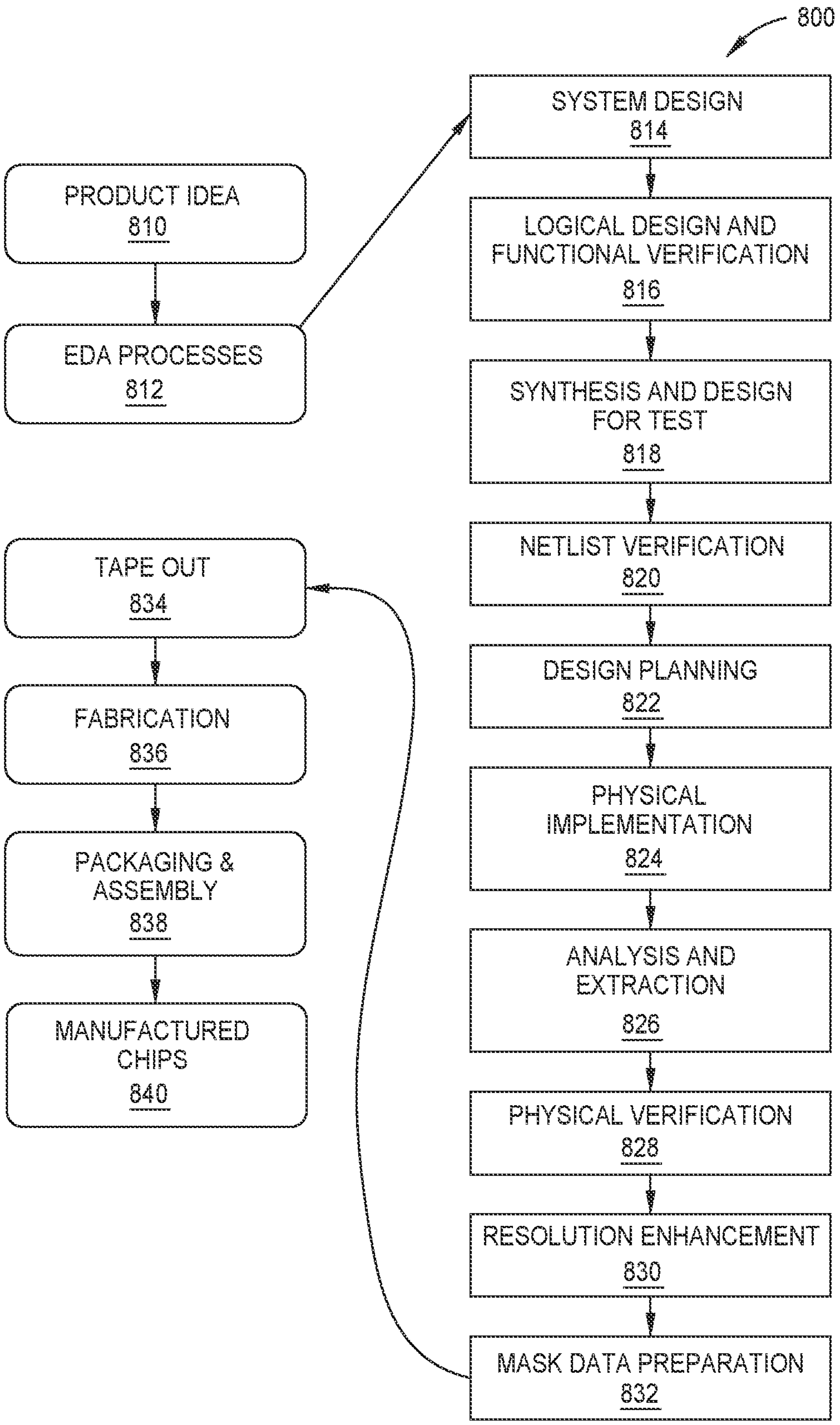
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
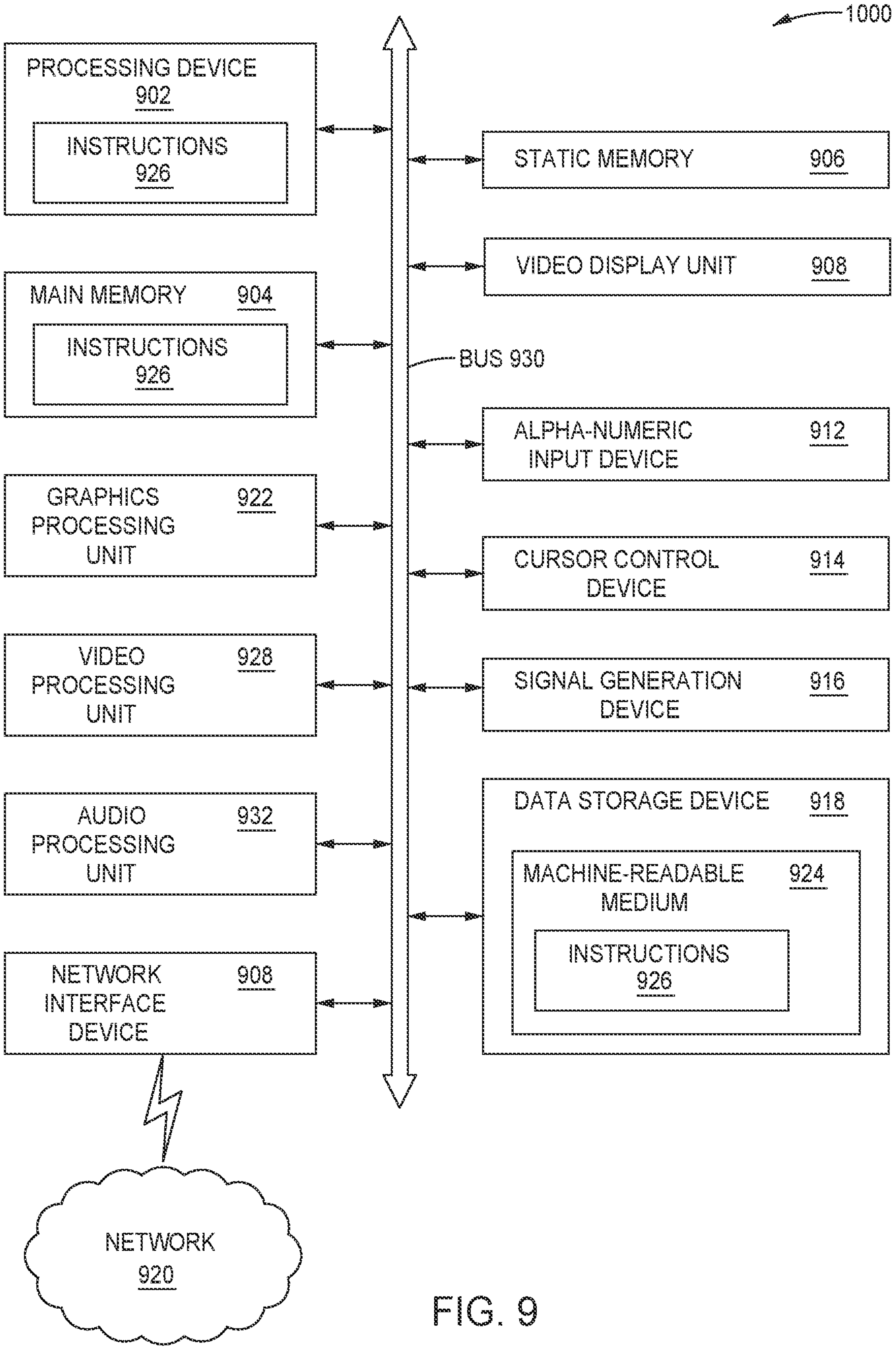
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 9004 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

receiving circuit design training data and circuit design test data, the circuit design training data including training nodes and training paths, wherein the training paths connect the training nodes including circuit components, and wherein the circuit design test data includes a first test node and a second test node;

determining testing information for the circuit components of each training path from the circuit design training data;

determining, by a processing device, a statistical representation of the circuit design test data based on the testing information and the circuit design test data; and determining first test information for a test path connecting the first test node with the second test node based on the statistical representation.

2. The method of claim 1, wherein the testing information includes one or more of statistical information and circuit parameter information.

3. The method of claim 1, wherein determining the testing information comprises determining a hashing table associating each circuit component type with respective testing information.

4. The method of claim 3, wherein the statistical representation is determined from the hashing table and includes at least one or more of a statistical graph model and a statistical path model.

5. The method of claim 1, wherein determining the testing information comprises determining a bookkeeping graph based on the training nodes and the training paths.

6. The method of claim 5, wherein the bookkeeping graph comprises edges and nodes, and the testing information is associated with the edges.

7. The method of claim 5, wherein the bookkeeping graph comprises edges and nodes, and the testing information is associated with the nodes.

8. The method of claim 5, wherein the first test information is determined from the bookkeeping graph and includes a statistical graph model.

9. The method of claim 5, wherein determining the first test information for the test path comprises combining the statistical representation determined from two or more bookkeeping graphs.

10. The method of claim 1, wherein determining the testing information for the circuit components of each training node from the circuit design training data comprises determining neighborhood information for each of the circuit components.

11. A non-transitory computer readable medium comprising stored instructions, which when executed by a processor, cause the processor to:

receive circuit design training data and circuit design test data, the circuit design training data including training nodes and training paths, wherein the training paths include connect the training nodes including circuit components, and wherein the circuit design test data includes a first test node and a second test node;

determine testing information for the circuit components of each training path from the circuit design training data;

determine a statistical representation of the circuit design test data based on the testing information and the circuit design test data; and determine first test information for a test path connecting the first test node with the second test node based on the statistical representation.

12. The non-transitory computer readable medium of claim 11, wherein the testing information includes statistical information or circuit parameter information.

13. The non-transitory computer readable medium of claim 11, wherein determining the testing information comprises determining a hashing table associating each circuit component type with respective testing information.

14. The non-transitory computer readable medium of claim 13, wherein the statistical representation is determined from the hashing table and includes at least one of a statistical graph model and a statistical path model.

15. The non-transitory computer readable medium of claim 11, wherein determining the testing information comprises determining a bookkeeping graph based on the training nodes and the training paths.

16. The non-transitory computer readable medium of claim 15, wherein the statistical representation is determined from the bookkeeping graph and includes a statistical graph model.

17. The non-transitory computer readable medium of claim 11, wherein determining the testing information for the circuit components of each training node from the circuit design training data comprises determining neighborhood information for each of the circuit components.

18. A system comprising:

a memory storing instructions; and a processing device, coupled with the memory and configured to execute the instructions, the instructions when executed cause the processing device to:

receive design training data and design test data, the design training data including training nodes and training paths, wherein the training paths include components and connect the training nodes, and wherein the design test data includes a first test node and a second test node;

determine testing information for the components of each training path from the design training data, the testing information includes entries including values associated with the components; and determine test information for a test path connecting the first test node with the second test node based on the entries of the components associated with the test path.

19. The system of claim 18, wherein determining the testing information comprises determining a bookkeeping graph, and wherein the entries are associated with nodes of the bookkeeping graph or edges of the bookkeeping graph.

20. The system of claim 18, wherein determining the testing information comprises determining a hashing table, and wherein the entries are associated with keys of the hashing table.

* * * * *